United States Patent
Sakurai et al.

(10) Patent No.: US 10,056,129 B1
(45) Date of Patent: Aug. 21, 2018

(54) CELL BOTTOM NODE RESET IN A MEMORY ARRAY

(71) Applicant: Micron Technology, Inc., Boise, ID (US)

(72) Inventors: Kiyotake Sakurai, Hino (JP); Yasushi Matsubara, Isehara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/674,382

(22) Filed: Aug. 10, 2017

(51) Int. Cl.
*G11C 11/22* (2006.01)
*G11C 11/56* (2006.01)

(52) U.S. Cl.
CPC ...... *G11C 11/2257* (2013.01); *G11C 11/2259* (2013.01); *G11C 11/2273* (2013.01); *G11C 11/2293* (2013.01); *G11C 11/2297* (2013.01); *G11C 11/221* (2013.01); *G11C 11/5657* (2013.01)

(58) Field of Classification Search
CPC ... G11C 11/22; G11C 11/221; G11C 11/2253; G11C 11/5657; G11C 11/2257; G11C 11/2259; G11C 11/2273; G11C 11/2293; G11C 11/2297

USPC ............... 365/145, 65, 49.13, 203, 204, 206
See application file for complete search history.

(56) References Cited

U.S. PATENT DOCUMENTS

| | | | |
|---|---|---|---|
| 2002/0018358 A1* | 2/2002 | Kato ...................... | G11C 11/22 365/145 |
| 2007/0109834 A1* | 5/2007 | Ogiwara ................ | G11C 11/22 365/145 |

* cited by examiner

*Primary Examiner* — Tan T. Nguyen
(74) *Attorney, Agent, or Firm* — Holland & Hart LLP

(57) ABSTRACT

Methods, systems, and devices for cell bottom node reset in a memory array are described. The memory array may include a plurality of ferroelectric memory cells having a cell bottom node and a cell plate opposite the cell bottom node. A zero voltage may be applied to a plurality of digit lines in the memory array. A plurality of word lines may be activated to electrically coupled the plurality of digit lines to cell bottom node of each of the ferroelectric memory cells. Accordingly, the cell bottom node of each of the ferroelectric memory cells may be reset to the zero voltage.

26 Claims, 16 Drawing Sheets

CELL BOTTOM NODE RESET IN A MEMORY ARRAY

BACKGROUND

The following relates generally to memory devices and more specifically to cell bottom node reset in a memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. The timing of various operations relative to other operations may affect whether such metrics are achieved. It may therefore be beneficial to coordinate various memory operations relative to one another to avoid delays, power consumption, or the like.

DETAILED DESCRIPTION

A memory array with ferroelectric cells may be configured to apply a zero voltage to a plurality of digit lines in a memory array and activate a plurality of word lines to electrically couple the plurality of digit lines to a plurality of cell bottom nodes and reset the plurality of cell bottom nodes to the zero voltage. This may allow the reset operation to be finished simultaneously or nearly simultaneously with a power up operation, instead of taking a longer time and potentially utilizing more power. The use of an internal command and an external power source may further reduced the power consumption.

Features of the disclosure are described below in the context of a memory array. Specific examples are then described for the configuration and operations of electronic memory devices that support cell bottom node reset in a memory array. These and other features of the disclosure are illustrated by and described with reference to apparatus diagrams, system diagrams, and flowcharts that relate to cell bottom node reset in a memory array.

Figure 1:
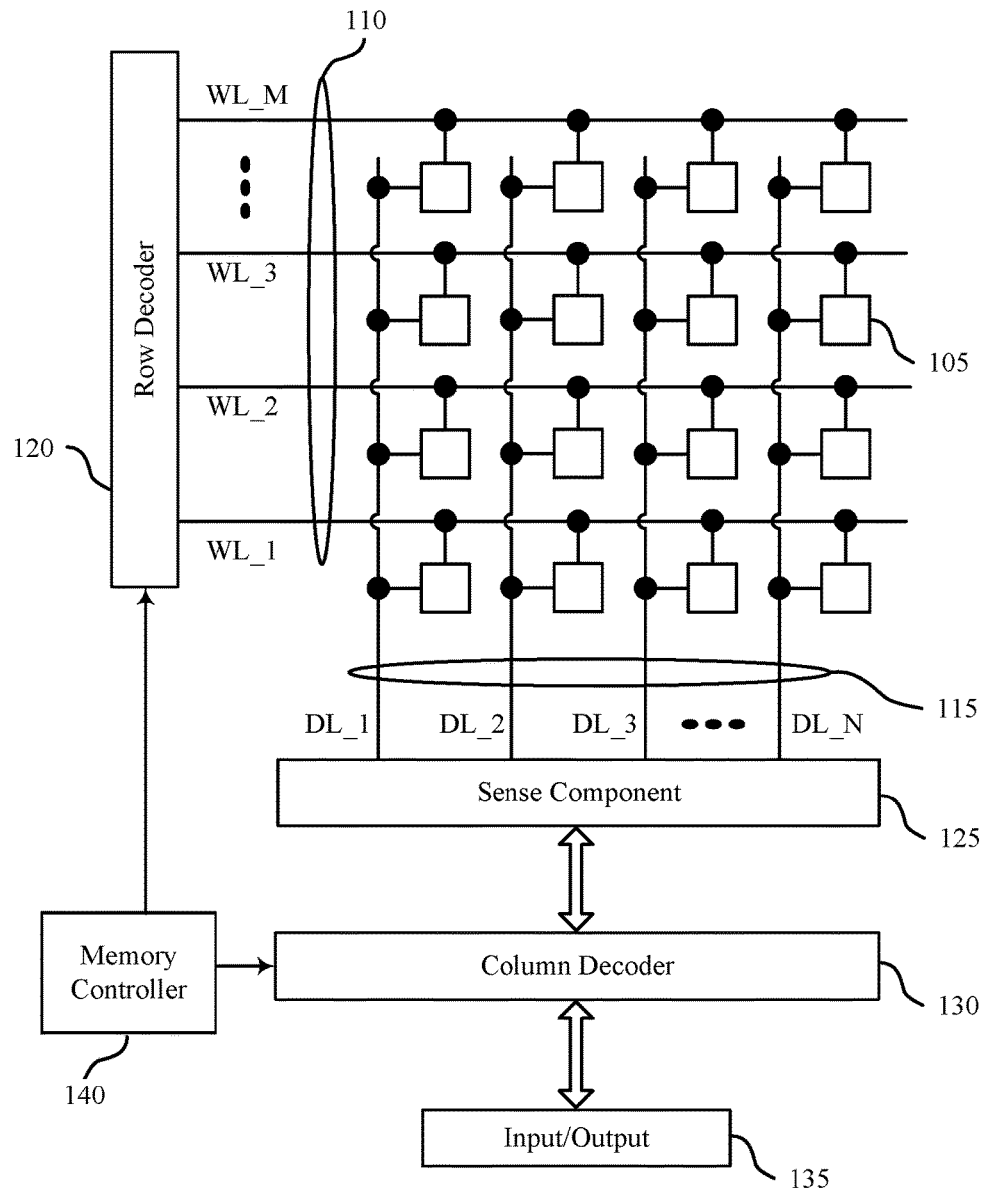
FIG. 1 illustrates an example of a memory array that supports cell bottom node reset in a memory array in accordance with embodiments of the present disclosure.

FIG. 1 illustrates an example memory array 100 that supports cell bottom node reset in a memory array in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a capacitor to store a charge representative of the programmable states; for example, a charged and uncharged capacitor may represent two logic states, respectively. Memory cell 105 may include a capacitor with a ferroelectric material. Ferroelectric materials have a spontaneous electric polarization—i.e., they have a non-zero polarization in the absence of an electric field. Different levels of charge of a ferroelectric capacitor may represent different logic states. Some details and advantages of a ferroelectric memory cell 105 are discussed below.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. For example, a zero voltage (i.e., the voltage of a cell plate) may be applied to the digit line 115 to reset the cell bottom node of a capacitor in memory array 100 after the word line 110 is activated.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. For example, the cell bottom node of a ferroelectric memory cell 105 may be reset to zero by applying a zero potential difference across the ferroelectric capacitor. The writing process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures. For example, ferroelectric material is characterized by a spontaneous electric polarization, i.e., it maintains a non-zero electric polarization in the absence of an electric field. In contrast, a linear or para-electric material exhibits polarization only in the presence of an external electric field. Because the electric polarization in a ferroelectric material may be maintained in the absence of an externally applied electric field for a relatively long time, even indefinitely, charge leakage may be significantly decreased as compared with, for example, para-electric capacitors employed in DRAM arrays. Therefore, ferroelectric memory cells may reduce or eliminate requirements to perform refresh operations when compared to DRAM cells.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously or nearly simultaneously; for example, multiple or all cells of memory array 100 may be accessed simultaneously during a reset operation in which all memory cells 105, or a group of memory cells 105, are set to a single logic state. In some examples, the memory controller 140 may transmit reset signals that cause the memory cells 105 in the memory array 100 to be reset. For example, the memory controller 140 may transmit reset signals that cause the cell bottom node of each of the memory cells 105 in the memory array 100 to be reset.

Figure 2:
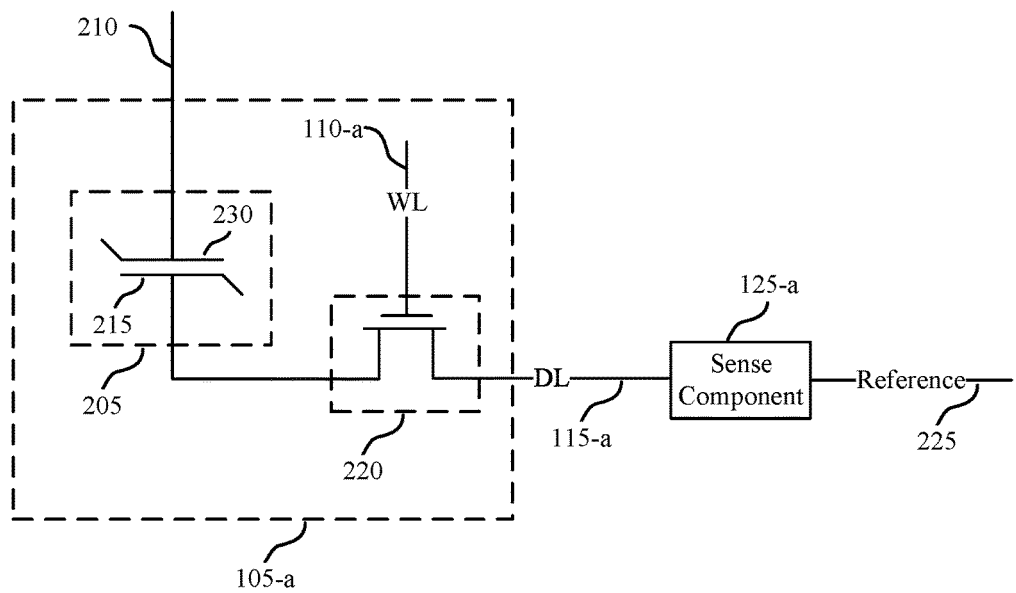
FIG. 2 illustrates an example of a circuit that supports cell bottom node reset in a memory array in accordance with embodiments of the present disclosure.

FIG. 2 illustrates an example circuit 200 that supports cell bottom node reset in a memory array in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

In some examples, the cell bottom 215 of memory cell 105-a may be rest by applying the appropriate signals to the word line 110-a and the digit line 115-a. The selection component 220 may be selected by activating word line 110-a, thereby connecting capacitor 205 with digit line 115-a. A zero voltage may be applied to digit line 115-a. The zero voltage corresponds to the voltage on the cell plate 230. The cell bottom 210 and the cell plate 230 may both have a zero voltage after the zero voltage is applied to the digit line 115-a, which may result in no voltage difference across capacitor 205.

The change in voltage of digit line 115-a may depend on its intrinsic capacitance—as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a.

Sense component 125-a may include various transistors or amplifiers to detect and amplify a difference in signals, which may be referred to as latching. Sense component 125-a may include a sense amplifier that receives and compares the voltage of digit line 115-a and reference signal 225, which may be a reference voltage. The sense amplifier output may be driven to the higher (e.g., a positive) or lower (e.g., negative or ground) supply voltage based on the comparison. For instance, if digit line 115-a has a higher voltage than reference signal 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference signal 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

Figure 3:
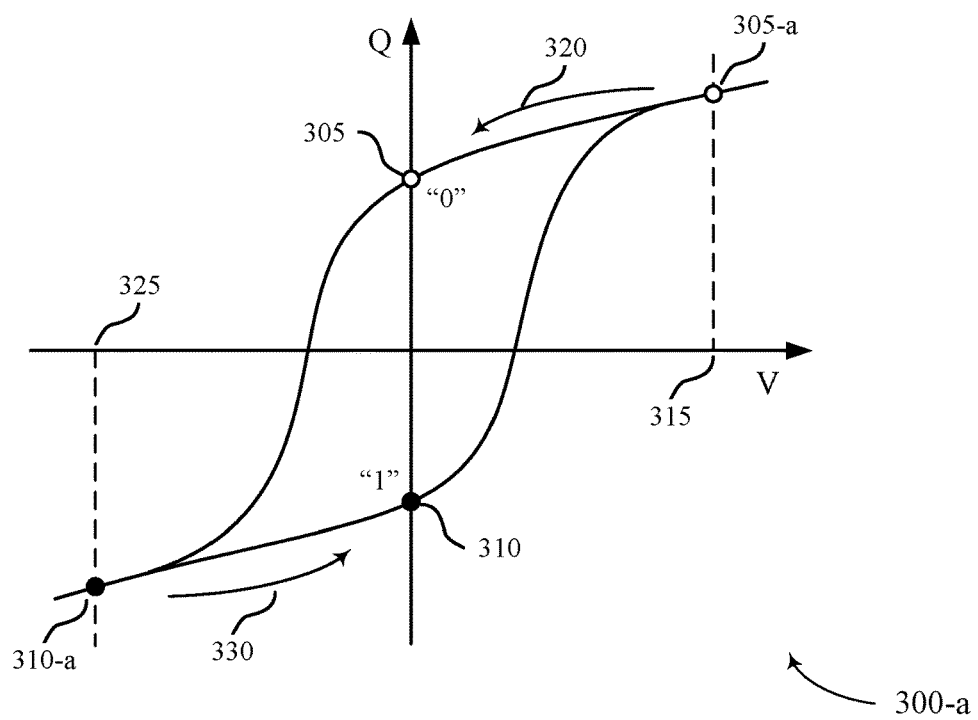
FIG. 3 illustrates examples of non-linear electrical properties with hysteresis loops that support cell bottom node reset in a memory array in accordance with embodiments of the present disclosure.
Figure 3:
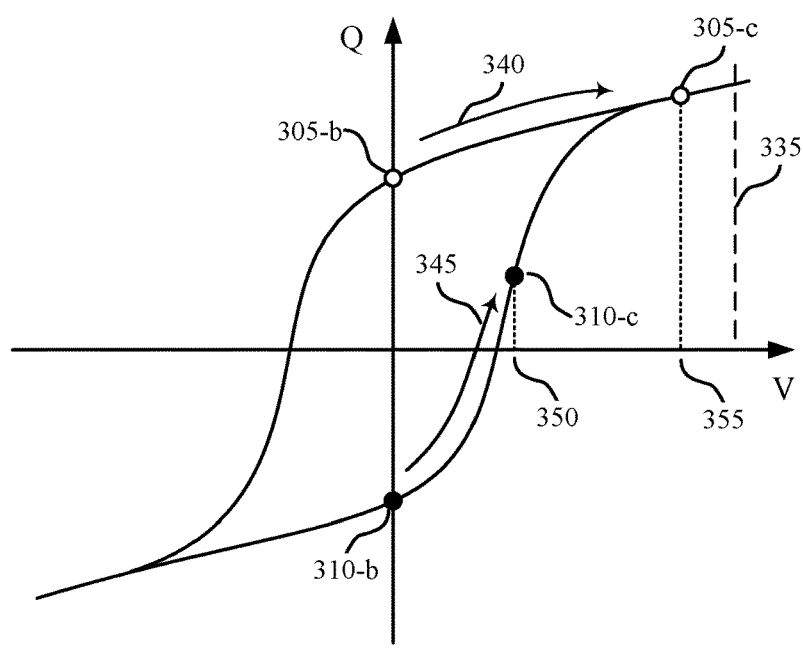

FIG. 3 illustrates examples of non-linear electrical properties with hysteresis curves 300-a (FIG. 3A) and 300-b (FIG. 3B) for a memory cell that supports cell bottom node reset in a memory array in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Charge may be accumulated on the cell bottom node of a ferroelectric memory cell. Because hysteresis curves 300 are based on the voltage across the capacitor, the accumulated charge may degrade the data stored on the memory cell. For example, charge may be accumulated on the cell bottom node during a power down process. However, during power up the cell plate may be driven to zero volts while the cell bottom node is in a floating state. Due to the accumulated charge, the cell bottom node tends to have a non-zero potential difference with respect to the cell plate. In order to prevent any degradation to the physical data stored at the memory cell, the cell bottom node may be reset.

Figure 4:
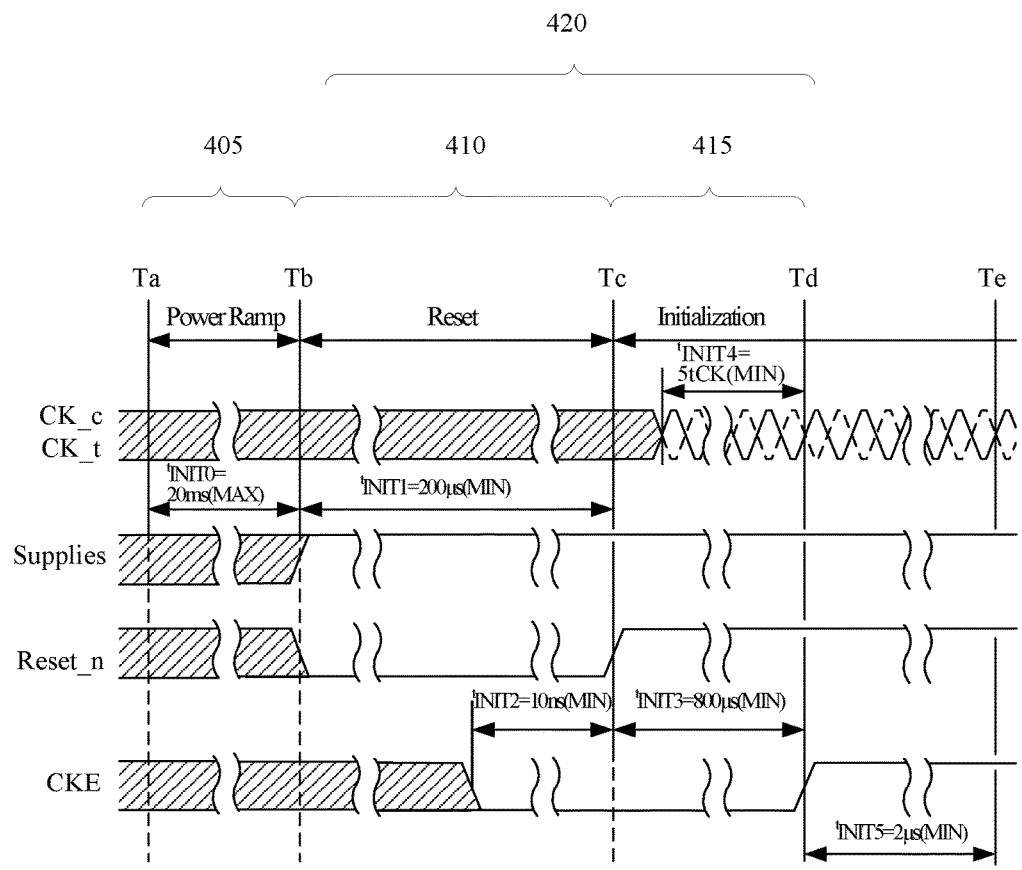
FIG. 4 illustrates an example of a timing diagram for a memory array that supports cell bottom node reset in a memory array in accordance with embodiments of the present disclosure.

FIG. 4 illustrates an example of a timing diagram 400 for a memory array that supports cell bottom node reset in a memory array in accordance with various embodiments of the present disclosure.

The timing diagram 400 illustrates three stages during the powering cycle for a memory array such as a ferroelectric memory array. The powering cycle includes a power ramp stage 405, a reset stage 410, and an initialization stage 415. After the initialization stage 415, the memory array may transition to the normal operating mode.

When a memory array is powered up, the cell plate and corresponding cell bottom of each memory cell may be at an unknown voltage. Each cell plate may be connected to the other cell plates, such that all cell plates have a "zero voltage." However, each cell bottom may be at a different voltage. During the powering cycle, the cell bottom nodes may be reset to the zero voltage such that there is zero potential difference between the cell plate and the cell node in each memory cell. The cell bottom nodes in the memory array may be reset during a reset period 420 in the reset stage 410 and the initialization stage 415. The reset period 420 may be about 1 millisecond or shorter.

In some examples, the cell bottom nodes in the memory array may be reset by applying the zero voltage to each of the digit lines in the memory array, and activating each of the word lines in the memory array to electrically couple the digit lines to the cell bottom nodes and reset the plurality of cell bottom nodes to the zero voltage. Thus, each of the cell bottom nodes may be reset simultaneously rather than in succession (e.g., by carrying out a reset process on each of the addresses based on an external command).

In some examples, the word lines may be activated based at least in part on a signal to perform a reset operation. The reset signal may be, for example, a power signal. In some examples, the memory array may include a voltage level detector configured to detect a voltage increase corresponding to a power-up operation. For example, the voltage level detector may be configured to detect that a power source voltage has met or exceeded a threshold. The memory array may issue one or more signals in response to detecting the reset signal that cause the memory array to apply the zero voltage to the digit lines and activate the word lines.

In some examples, each memory cell may include a switching component that connects the zero voltage source to the digit lines. The switching component may be configured to electrically couple the zero voltage source to the digit line when an equalize line is activated, and to electrically isolate the zero voltage source from the digit line when the equalize line is not activated. The switching component may be, for example, a transistor. In some examples, applying the zero voltage to the digit lines may include activating the equalize lines to electrically couple the zero voltage source to the digit lines.

In some examples, each memory cells may include a selection component that connects the digit line to the cell bottom node. The selection component may be an example of aspects of selection component 220 described with reference to FIG. 2. The selection component may be configured to electrically couple the digit line to the cell bottom node when the word line is activated, and to electrically isolate the digit line from the cell bottom node when the word line is not activated. The selection component may be, for example, a transistor.

In some examples, activating the word lines to electrically couple the digit lines to the cell bottom nodes may include applying an activation voltage to the word lines by an external power source. The external power source may be connected to the word lines by a power source selection component. The power source selection component may be configured to electrically couple the external power source to the word lines when a reset line is activated, and to electrically isolate the external power source from the word lines when the reset line is not activated.

In some examples, the cell bottom reset technique may also be used to perform a data wipe-out operation. For example, after the cell bottom nodes are reset, a physical data "0" may be written to each of the plurality of memory cells. The physical data "0" may be written, for example, by raising a cell plate voltage of each of the plurality of cell plates.

By resetting each of the cell bottom nodes simultaneously, rather than in succession, the process may be completed much faster and well within the reset period 420. For example, in one test a simultaneous reset process finished in 0.5 milliseconds while a serial reset process finished in 0.98 milliseconds, close to a 1 millisecond reset period and too slow for a shorter reset period. The simultaneous reset process also consumed less power (4.52 mW as opposed to 16.08 mW for the serial process) and required less current (2.51 mA as opposed to 8.93 mA for the serial process).

Figure 5:
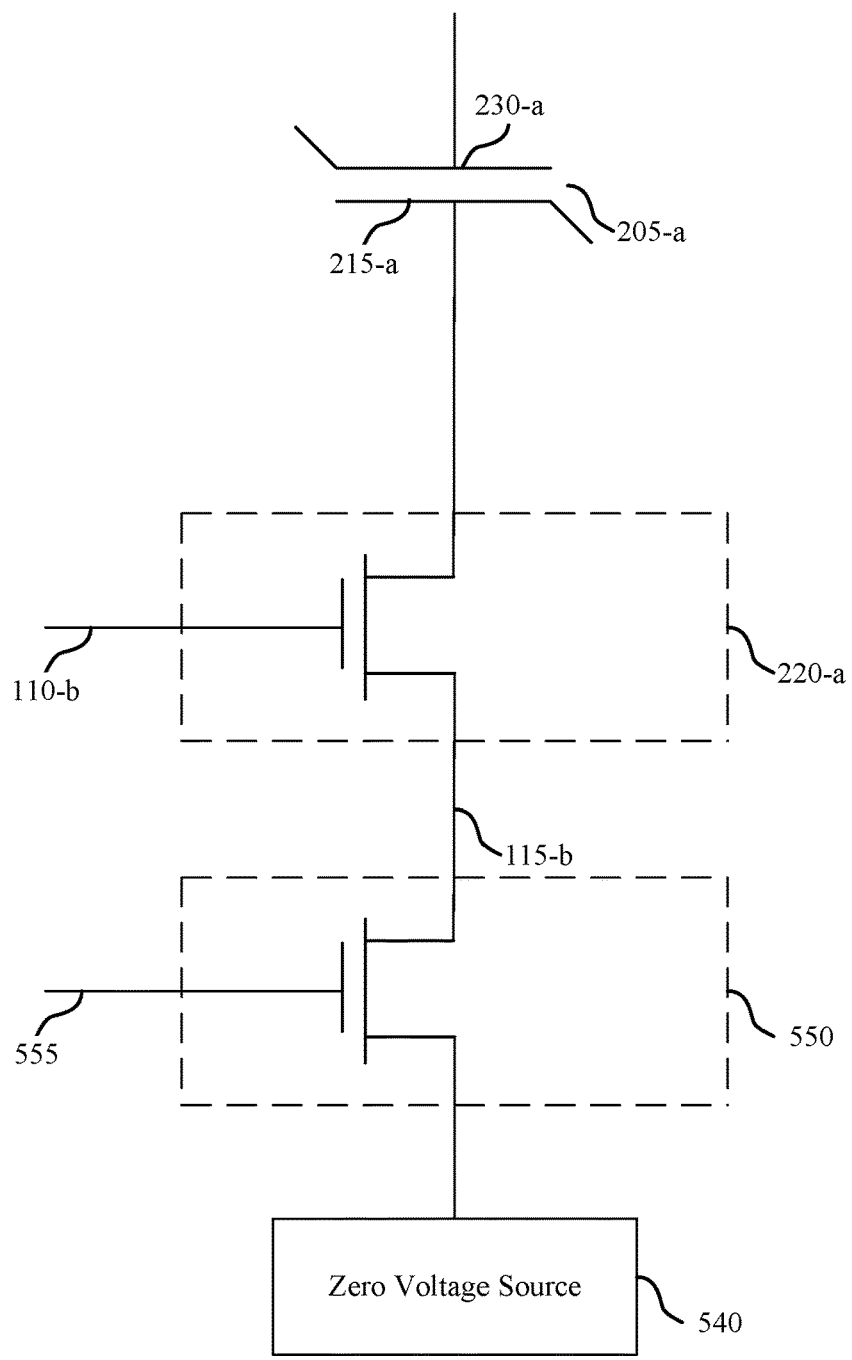
FIG. 5 illustrates an example of a circuit for a memory cell that supports cell bottom node reset in a memory array in accordance with embodiments of the present disclosure.

FIG. 5 illustrates an example circuit 500 that supports cell bottom node reset in a memory array in accordance with various embodiments of the present disclosure. Circuit 500 includes a memory cell 105-$b$, word line 110-$b$, and digit line 115-$b$, which may be examples of and may include the same features as or different features as memory cell 105, word line 110, and digit line 115, respectively, as described with reference to FIG. 1. Memory cell 105-$b$ may include a logic storage component, such as capacitor 205-$a$ that has a first plate, cell plate 230-$a$, and a second plate, cell bottom 215-$a$. The capacitor 205-$a$, cell plate 230-$a$, and cell bottom 215-$a$ may be examples of a capacitor 205, cell plate 230, and cell bottom 215, respectively, as described with reference to FIG. 2. Cell plate 230-$a$ and cell bottom 215-$a$ may be capacitively coupled through a ferroelectric material positioned between them. The orientation of cell plate 230-$a$ and cell bottom 215-$a$ may be flipped without changing the operation of memory cell 105-$b$. Circuit 500 also includes selection component 220-$a$ which may be an example of a selection component 220 as described with reference to FIG. 2.

Circuit 500 further includes a zero voltage source 540 and a switching component 550. The zero voltage source is a voltage source that has the same voltage as the cell plate 230-$a$, such that there is a zero potential difference between the zero voltage source and the cell plate 230-$a$. This voltage may also be referred to a "zero voltage." In some examples, the zero voltage source may be a part of a sense component such as the sense component 125 as described with reference to FIG. 1 or the sense component 125-$a$ as described with reference to FIG. 2.

The switching component 550 may physically connect the digit line 115-$b$ to the zero voltage source 540. The digit line 115-$b$ may be electrically isolated from zero voltage source 540 when switching component 550 is deactivated, and digit line 115-$b$ may be electrically connected to zero voltage source 540 when switching component 550 is deactivated. In some cases, switching component 550 may be a transistor and operation of switching component 550 may be controlled by applying a voltage to the transistor gate, where the voltage magnitude is greater than the threshold magnitude of the transistor. Equalize line 555 may activate switching component 550; for example, a voltage applied to equalize line 555 is applied to the transistor gate, electrically connecting digit line 115-$b$ with zero voltage source 540.

Figure 6:
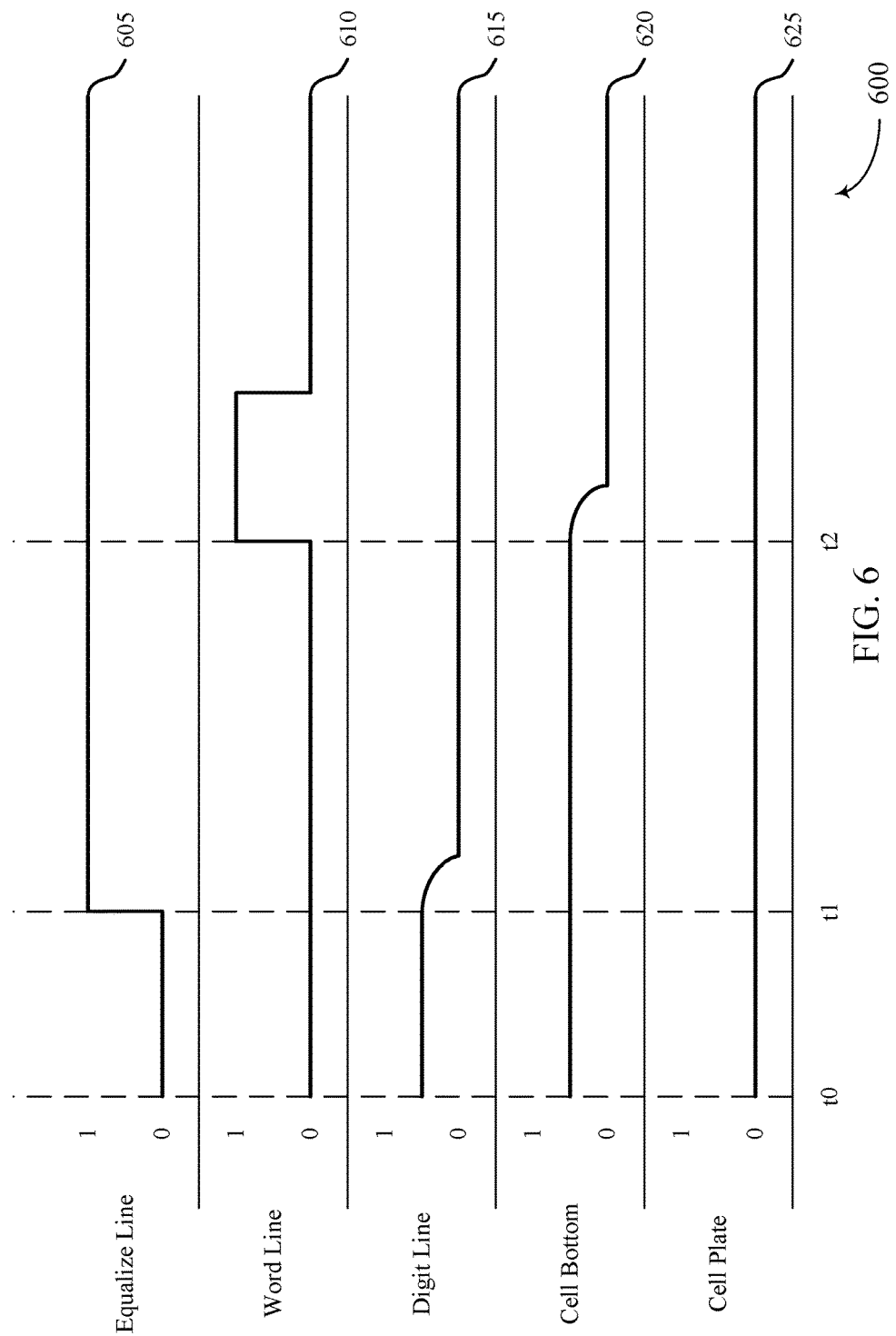
FIG. 6 illustrates an example of a timing diagram for a memory array that supports cell bottom node reset in a memory array in accordance with embodiments of the present disclosure.

FIG. 6 illustrates an example of a timing diagram 600 for a ferroelectric memory array that supports cell bottom node reset in a memory array in accordance with various embodiments of the present disclosure. The ferroelectric memory array may include a plurality of circuits such as circuit 500 as described with reference to FIG. 5.

Timing diagram 600 shows a signal 605 for an equalize line, a signal 610 for a word line, a signal 615 for a digit line, a signal 620 for a cell bottom, and a signal 630 for a cell plate. The equalize line, word line, digit line, cell bottom, and cell plate may be examples of equalize line 555, word line 110-$b$, digit line 115-$b$, cell bottom 205-$a$, and cell plate 210-$a$ as described with reference to FIG. 5.

Time t0 may occur just after the ferroelectric memory array is powered on. The signal 605 for the equalize line and the signal 610 for the word line may be controlled by a memory controller. The signal 625 for the cell plate may be at a stable low (zero) voltage. The signal 615 for the digit line and the signal 620 for the cell bottom may be at an indeterminate level.

At time t1, the memory controller may activate the equalize line by setting the signal 605 on the equalize line to a logic '1', which may result in the digit line being electrically connected to the voltage source. Accordingly, the signal 615 on the digit line may drop to match the zero voltage on the cell plate. At time t2, the memory controller may activate the word line by setting the signal 610 on the word line to a logic '1'. Accordingly, the signal 620 on the cell bottom may drop to match the zero voltage on the cell plate because the cell bottom is electrically connected to the digit line.

Figure 7:
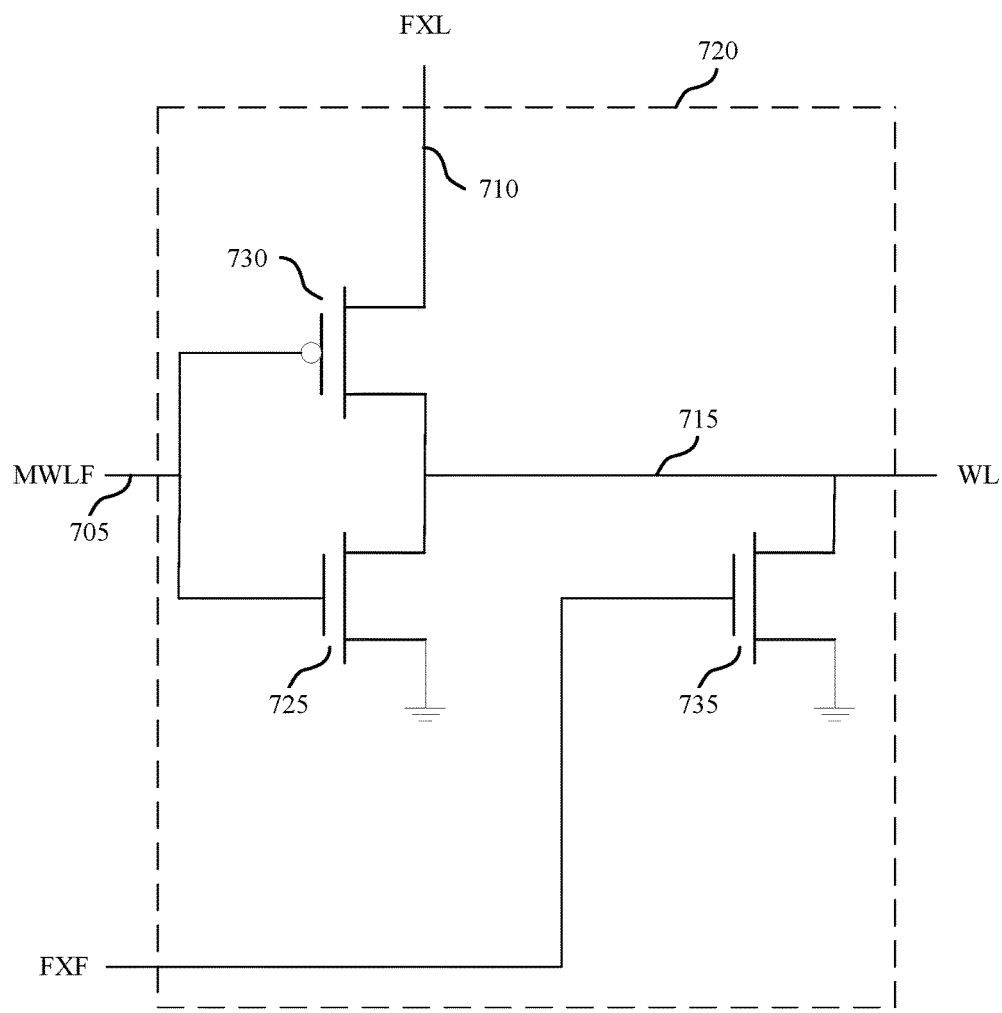
FIG. 7 illustrates an example of a word line driver circuit that supports cell bottom node reset in a memory array in accordance with embodiments of the present disclosure.

FIG. 7 illustrates an example circuit 700 in a ferroelectric memory array that supports cell bottom node reset in a memory array in accordance with various embodiments of the present disclosure. The circuit 700 includes a main word line false (MWLF) 705 (e.g., the NOT condition of the main word line MWL), a Phase X line (FXL) 710, and a word line (WL) 715. The word line may be an example of word line 110 as described with reference to FIG. 1, word line 110-a as described with reference to FIG. 2, or word line 110-b as described with reference to FIG. 3. The circuit 700 further includes a Phase X (FX) selection component 720. The FX selection component 720 may be configured to electrically connect the FXL 710 to the word line 715 when the MWL 705 is activated and electrically connect the word line 715 to ground when the MWL is deactivated.

The FX selection component 720 may include a first transistor 725, a second transistor 730, and a third transistor 735. The first transistor 725 may be configured to electrically connect WL 715 to ground when the MWLF is activated (e.g., when the main word line MWL is not activated). The second transistor 730 may be configured to electrically connect WL 715 to FX 710 when the MWLF is not activated (e.g., when the main word line MWL is activated). The third transistor 735 may be configured to electrically connect WL 715 to ground when FXF (the NOT condition of FXL 710) is activated, i.e., when FXL 710 is not activated.

Figure 8:
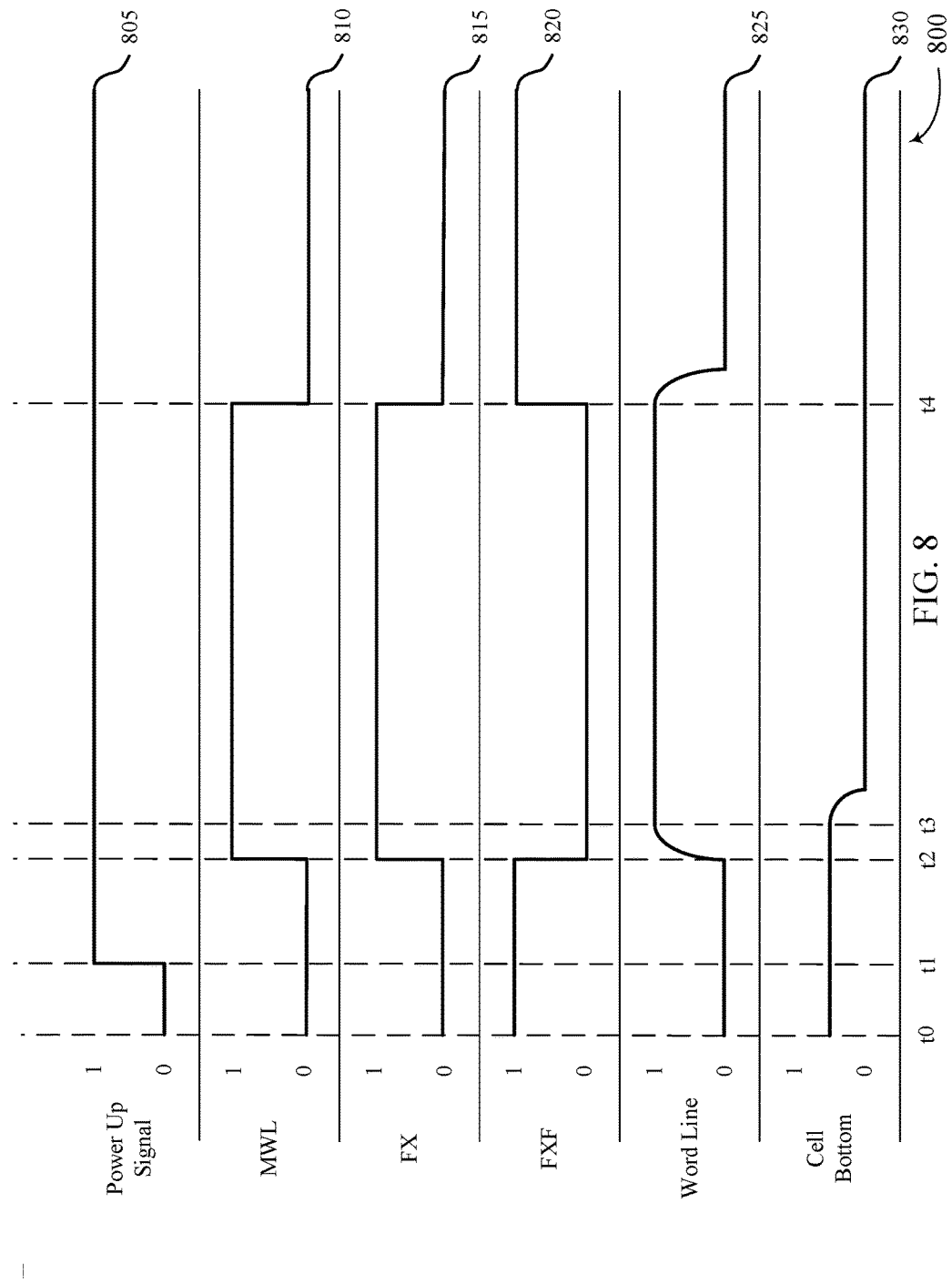
FIG. 8 illustrates an example of a timing diagram for a memory array that supports cell bottom node reset in a memory array in accordance with embodiments of the present disclosure.

FIG. 8 illustrates an example of a timing diagram 800 for a memory array that supports cell bottom node reset in a memory array in accordance with various embodiments of the present disclosure. The timing diagram 800 shows signals that may be used in an electronic circuit such as electronic circuit 700 described with reference to FIG. 7.

Timing diagram 800 includes a power up signal 805, a MWL signal 810, a FX signal 815, a FXF signal 820, a WL signal 825, and a cell bottom signal 830. At time to, the power up signal 805, MWL signal 810, FX signal 815, and WL signal 825 may be set to a logic "0", while the cell bottom signal 830 may be at an indeterminate level. A cell plate signal (not shown) has a constant zero voltage.

At time t1, a power up signal may be changed to a logic "1", e.g., in response to command from a user. At time t2, the MWL signal 810 and the FX signal 815 may be changed to a logic "1". The MWL signal 810 and the FX signal 815 may be activated based at least in part on the activation of the power up signal. In some examples, the MWL signal 810 and the FX signal 815 may be activated by a memory controller.

In response to the activation of the MWL signal 810 and the FX signal 815, the WL signal 825 may be changed to a logic "1". For example, the WL signal 825 may be changed to a logic "1" using the circuit 700 described with reference to FIG. 7. At time t3, the change in the WL signal 825 may cause the cell bottom signal 830 to drop to match the zero voltage on the cell plate because the cell bottom is electrically connected to the digit line which may be charged to zero voltage as described with reference to FIGS. 5 and 6.

At time t4, the MWL signal 810 and the FX signal 815 may be changed to a logic "0", which may cause the WL signal 825 to also change to a logic "0". The cell bottom signal 830 may not be affected by this change.

Figure 9:
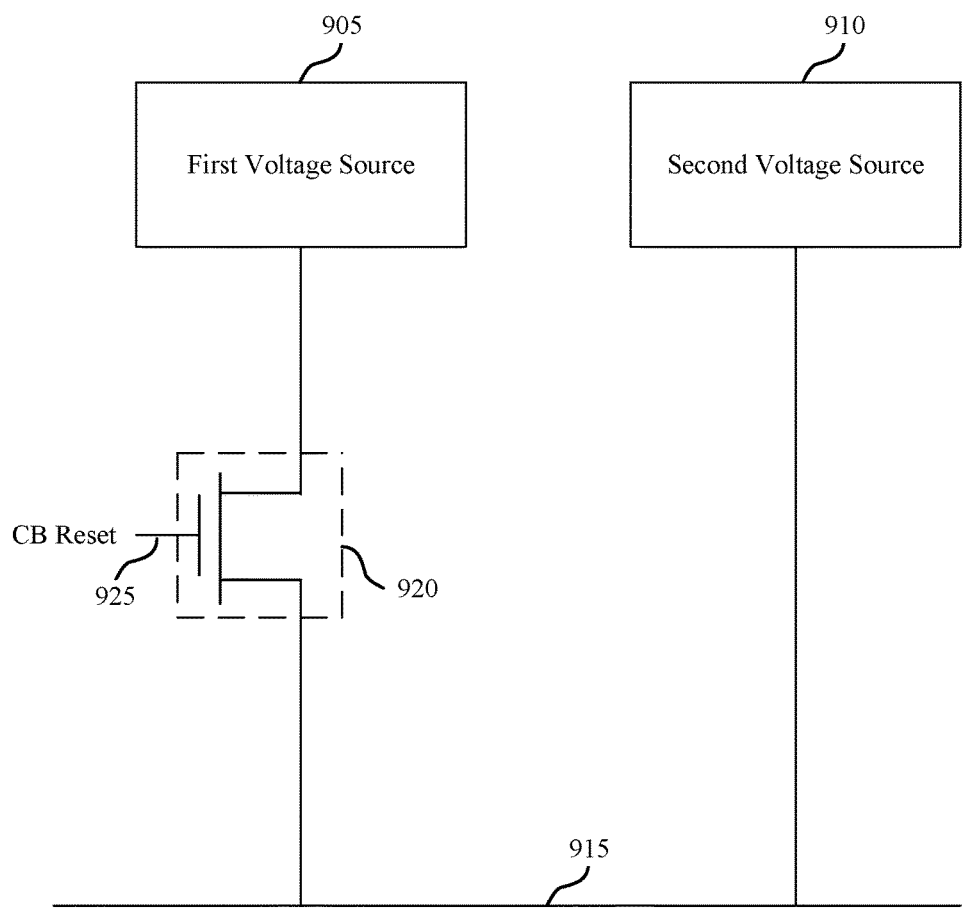
FIG. 9 illustrates an example of a FX driver circuit that supports cell bottom node reset in a memory array in accordance with embodiments of the present disclosure.

FIG. 9 illustrates an example of a FX driver circuit 900 that supports cell bottom node reset in a memory array in accordance with various embodiments of the present disclosure. The FX driver circuit may include a first voltage source 905, a second voltage source 910, and a FX line 915. FX line 915 may be connected to a circuit for driving the word lines such as circuit 700 described with reference to FIG. 7.

The first voltage source 905 may be an external power supply. The second voltage source 910 may be a pumped voltage supply. The first voltage source 905 may be connected to FX line 915 by an external voltage source selection mechanism 920. The external voltage source selection mechanism 920 may be configured to electrically connect the first voltage source 905 to FX line 915 when a CB reset signal 925 is activated, and to electrically isolate the first voltage source 905 from the FX line 915 when the CB reset signal 925 is not activated.

In some examples, the CB reset signal 925 may be activated based at least in part on determining that the power up signal has been activated. The first voltage source 905 may then be used to activate the FX line 915 and accordingly the word lines as described with reference to FIG. 8. In this manner, the cell bottom node may be reset without requiring power from any internal power source (e.g., second voltage source 910). After the cell bottom nodes in the memory array have been reset, the CB reset signal 925 may be deactivated and the second voltage source 910 may be utilized for regular operation of the memory array.

Figure 10:
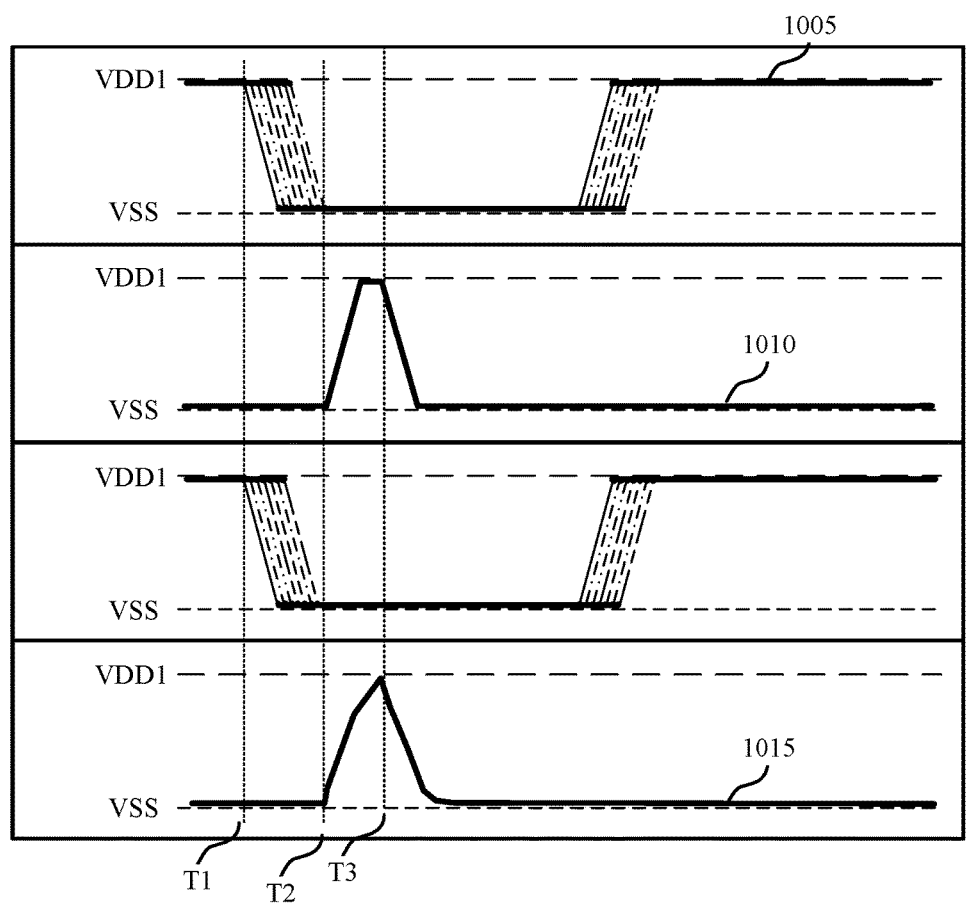
FIG. 10 illustrates an example of a timing diagram for a memory array that supports cell bottom node reset in a memory array in accordance with embodiments of the present disclosure.

FIG. 10 illustrates an example of a timing diagram 1000 for a ferroelectric memory array that supports cell bottom node reset in a memory array in accordance with various embodiments of the present disclosure. The memory array may include a plurality of circuits such as circuit 900 described with reference to FIG. 9.

Timing diagram 1000 shows a MWLF signal 1005, a FXL signal 1010, and a WL signal 1015. Time t0 may occur just after the memory array is powered on. The MWL false (MWLF) signal 1005, FXL signal 1010, and WL signal 1015 may be controlled by a memory controller.

At time t1, the MWLs may be activated by setting the MWLF signal 1005 to the VSS voltage. At time t2, the FXLs may be activated by setting the FXL signal 1010 to the VDD voltage. The FXL signal 1010 may be set to the VDD voltage by activating a CB reset signal 925 as described with reference to FIG. 9. The WL signal 1015 may correspondingly increase to the VDD voltage based at least in part on the increase in the FXL signal 1010. For example, the memory array may include a circuit 700 as described with reference to FIG. 7, and the WL signal 1015 may increase to the VDD voltage based on the values of the MWLF signal 1005 (the inverse of the MWL signal) and the FXL signal 1010. The increase in the WL signal 1015 may cause the cell bottom nodes to be reset as described with reference to FIGS. 4-8.

At time t3, the FXL signal 1010 may be decreased to VSS (e.g., by deactivating the CB reset line as described with reference to FIG. 9), which may cause a corresponding decrease in the WL signal 1015. The memory array may then proceed with normal operation.

Figure 11:
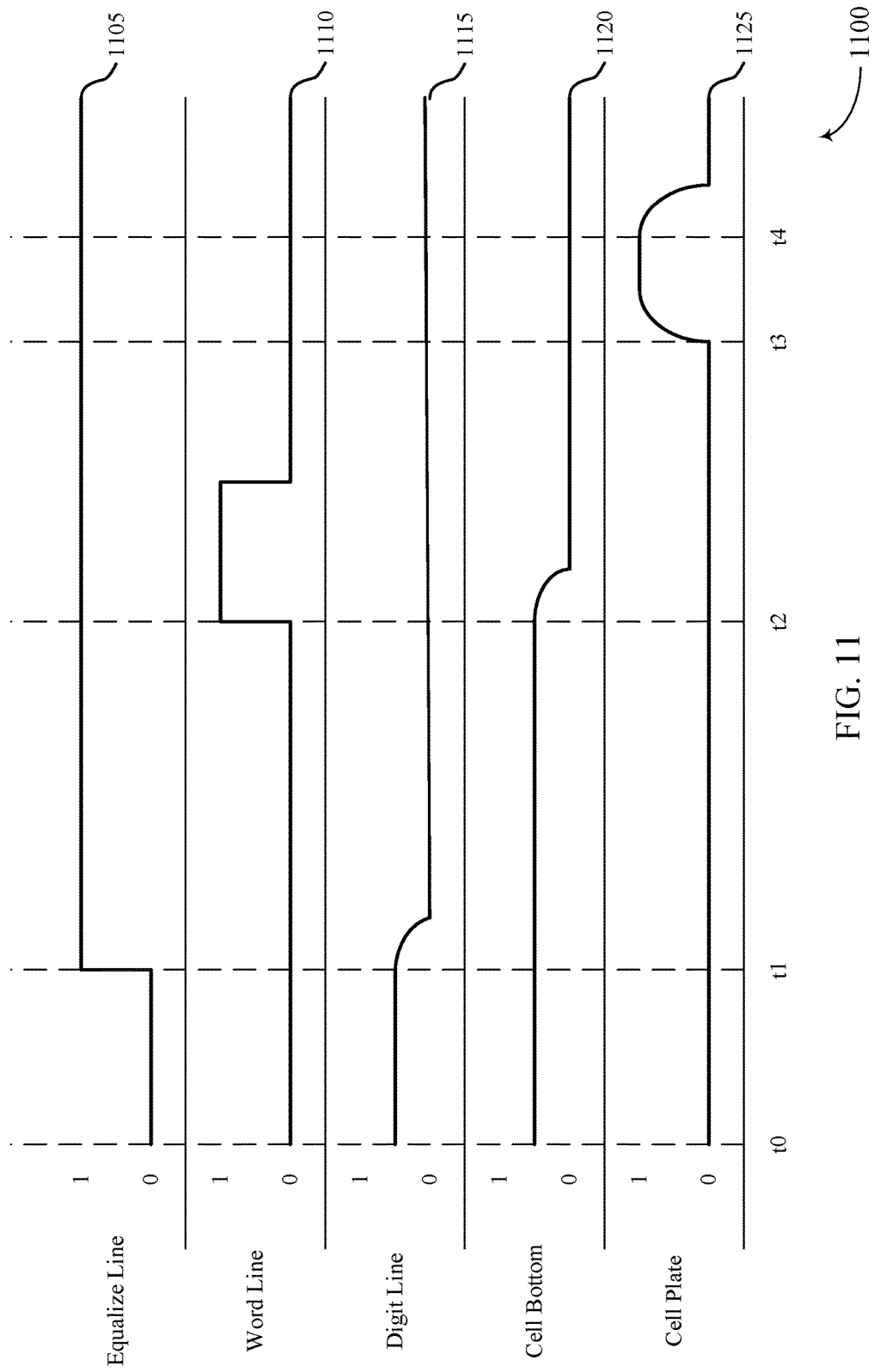
FIG. 11 illustrates an example of a timing diagram for a memory array that supports cell bottom node reset in a memory array in accordance with embodiments of the present disclosure.

FIG. 11 illustrates an example of a timing diagram 1100 for a ferroelectric memory array that supports a wipe-out operation in a memory array in accordance with various embodiments of the present disclosure. The ferroelectric memory array may include a plurality of circuits such as circuit 500 as described with reference to FIG. 5.

Timing diagram 1100 shows a signal 1105 for an equalize line, a signal 1110 for a word line, a signal 1115 for a digit line, a signal 1120 for a cell bottom, and a signal 1125 for a cell plate. The equalize line, word line, digit line, cell bottom, and cell plate may be examples of equalize line 555, word line 110-b, digit line 115-b, cell bottom 205-a, and cell plate 210-a as described with reference to FIG. 5.

Time t0 may occur just after the ferroelectric memory array is powered on. The signal 1105 for the equalize line and the signal 1110 for the word line may be controlled by a memory controller. The signal 1125 for the cell plate may be at a stable low (zero) voltage. The signal 1115 for the digit line and the signal 1120 for the cell bottom may be at an indeterminate level.

At time t1, the memory controller may activate the equalize line by setting the signal 1105 on the equalize line to a logic '1', which may result in the digit line being electrically connected to the voltage source. Accordingly, the signal 1115 on the digit line may drop to match the zero voltage on the cell plate. At time t2, the memory controller may activate the word line by setting the signal 1110 on the word line to a logic '1'. Accordingly, the signal 1120 on the cell bottom may drop to match the zero voltage on the cell plate because the cell bottom is electrically connected to the digit line.

At time t3, the memory controller may initiate a wipe-out operation. The wipe-out operation may be used, for example, as a security countermeasure when the device is discarded, or as a forceful "0" writing operation for the purpose of avoiding an imprint effect of ferroelectric cap. The wipe-out operation may include writing a physical "0" in a memory cell, which may be accomplished by raising the voltage of the cell plates in the memory array. In some other examples, the wipe-out operation may include writing a physical "1" in at least some memory cells and in some cases in all memory cells.

At time t3, the memory controller may raise the voltage of the cell plate and the signal 1125 on the cell plate may increase above the zero voltage level. At time t4, the memory controller may exit the wipe-out procedure and the signal 1125 may drop to the zero voltage value.

Figure 12:
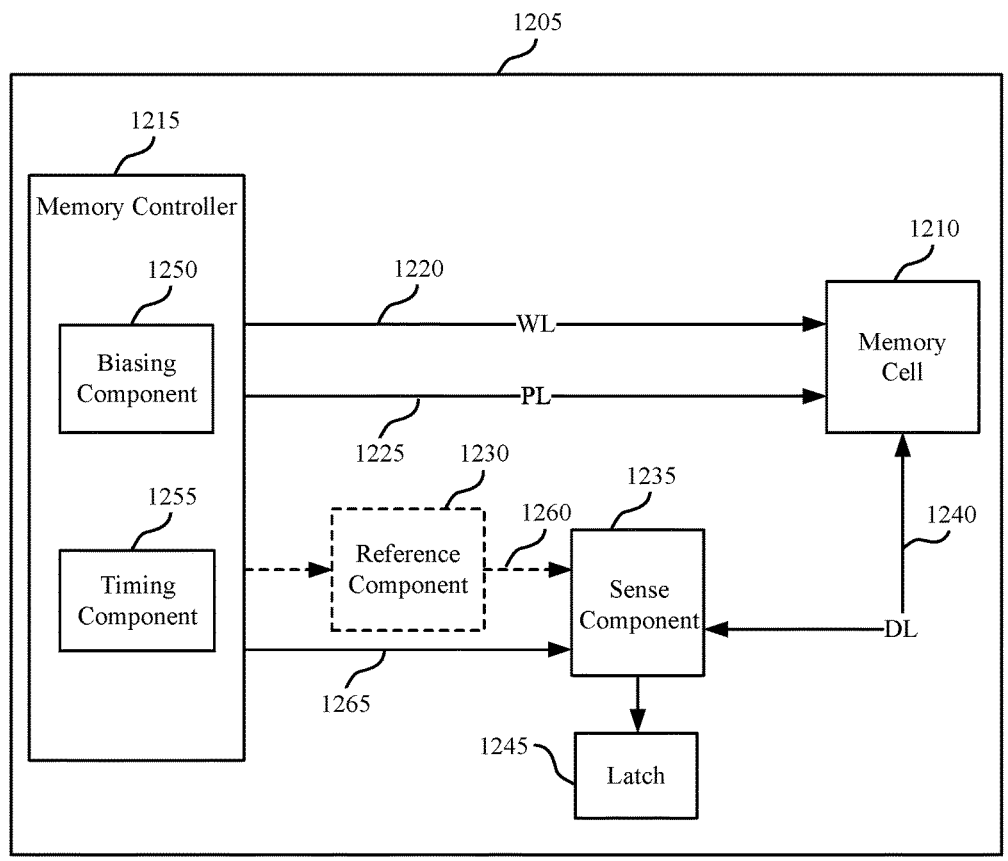
FIGS. 12 through 13 show block diagrams of a device that supports cell bottom node reset in a memory array in accordance with embodiments of the present disclosure.

FIG. 12 shows a block diagram 1200 of a memory array 1205 that supports cell bottom node reset and wipe-out operations in a memory array in accordance with embodiments of the present disclosure. Memory array 1205 may be referred to as an electronic memory apparatus, and may be an example of a component of a memory array 100 as described herein.

Memory array 1205 may include one or more memory cells 1210, a memory controller 1215, a word line 1220, a plate line 1225, a reference generator 1230, a sense component 1235, a digit line 1240, and a latch 1245. These components may be in electronic communication with each other and may perform one or more of the functions described herein. In some cases, memory controller 1215 may include biasing component 1250 and timing component 1255. In some cases, sense component 1235 may serve as the reference generator 1230. In other cases, reference generator 1230 may be optional.

Memory controller 1215 may be in electronic communication with word line 1220, digit line 1240, sense component 1235, and plate line 1225, which may be examples of word line 110, digit line 115, sense component 125, and plate line 210 described with reference to FIGS. 1, and 2. Memory array 1205 may also include reference generator 1230 and latch 1245. The components of memory array 1205 may be in electronic communication with each other and may perform aspects of the functions described with reference to FIGS. 1 through 11. In some cases, reference generator 1230, sense component 1235, and latch 1245 may be components of memory controller 1215.

In some examples, digit line 1240 is in electronic communication with sense component 1235 and a ferroelectric capacitor of ferroelectric memory cells 1210. A ferroelectric memory cell 1210 may be writable with a logic state (e.g., a first or second logic state). Word line 1220 may be in electronic communication with memory controller 1215 and a selection component of ferroelectric memory cell 1210. Plate line 1225 may be in electronic communication with memory controller 1215 and a plate of the ferroelectric capacitor of ferroelectric memory cell 1210. Sense component 1235 may be in electronic communication with memory controller 1215, digit line 1240, latch 1245, and reference line. Reference generator 1230 may be in electronic communication with memory controller 1215 and reference line. Sense control line may be in electronic communication with sense component 1235 and memory controller 1215. These components may also be in electronic communication with other components, both inside and outside of memory array 1205, in addition to components not listed above, via other components, connections, or buses.

Memory controller 1215 may be configured to activate word line 1220, plate line 1225, or digit line 1240 by applying voltages to those various nodes. For example, biasing component 1250 may be configured to apply a voltage to operate memory cell 1210 to read or write memory cell 1210 as described above. In some cases, memory controller 1215 may include a row decoder, column decoder, or both, as described herein. This may enable memory controller 1215 to access one or more memory cells 105. Biasing component 1250 may also provide voltage to reference generator 1230 in order to generate a reference signal for sense component 1235. Additionally, biasing component 1250 may provide voltage for the operation of sense component 1235.

In some cases, memory controller 1215 may perform its operations using timing component 1255. For example, timing component 1255 may control the timing of the various word line selections or plate biasing, including timing for switching and voltage application to perform the memory functions, such as reading and writing, discussed herein. In some cases, timing component 1255 may control the operations of biasing component 1250.

Reference generator 1230 may include various components to generate a reference signal for sense component 1235. reference generator 1230 may include circuitry configured to produce a reference signal. In some cases, reference generator 1230 may be implemented using other ferroelectric memory cells 105. Sense component 1235 may compare a signal from memory cell 1210 (through digit line 1240) with a reference signal from reference generator 1230. Upon determining the logic state, the sense component may then store the output in latch 1245, where it may be used in accordance with the operations of an electronic device that memory array 1205 is a part. Sense component 1235 may include a sense amplifier in electronic communication with the latch and the ferroelectric memory cell.

Memory controller 1215 may be an example of aspects of the memory controller 1415 described with reference to FIG.

14. Memory controller 1215 and/or at least some of its various sub-components may be implemented in hardware, software executed by a processor, firmware, or any combination thereof. If implemented in software executed by a processor, the functions of the memory controller 1215 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 1215 and/or at least some of its various sub-components may be physically located at various positions, including being distributed such that portions of functions are implemented at different physical locations by one or more physical devices.

In some examples, memory controller 1215 and/or at least some of its various sub-components may be a separate and distinct component in accordance with various embodiments of the present disclosure. In other examples, memory controller 1215 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Memory controller 1215 may apply a zero voltage to a set of digit lines in a memory array, the memory array including a set of ferroelectric memory cells including a set of cell bottom nodes and a set of cell plates opposite the set of cell bottom nodes and activate a set of word lines to electrically couple the set of digit lines to the set of cell bottom nodes and reset the set of cell bottom nodes to the voltage.

Figure 13:
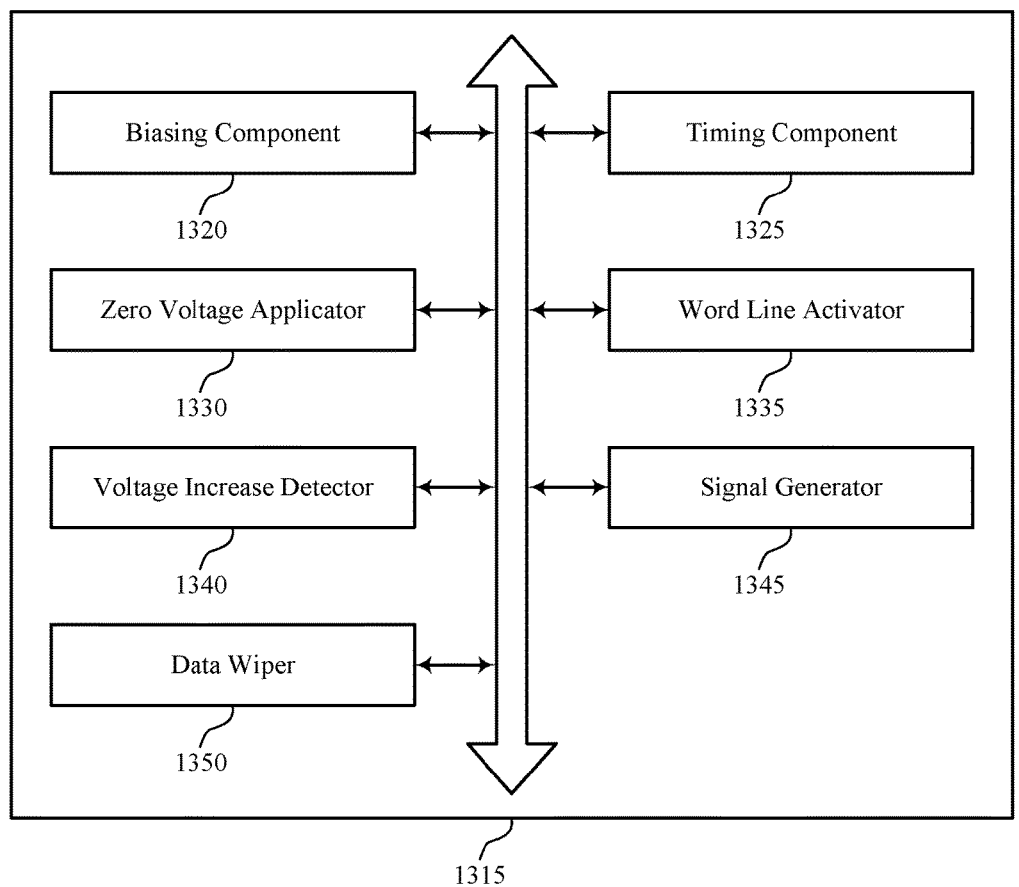

FIG. 13 shows a block diagram 1300 of a memory controller 1315 that supports cell bottom node reset and wipe-out operations in a memory array in accordance with embodiments of the present disclosure. The memory controller 1315 may be an example of aspects of a memory controller 1415 described with reference to FIGS. 12 and 14. The memory controller 1315 may include biasing component 1320, timing component 1325, zero voltage applicator 1330, word line activator 1335, voltage increase detector 1340, signal generator 1345, and data wiper 1350. Each of these modules may communicate, directly or indirectly, with one another (e.g., via one or more buses).

Zero voltage applicator 1330 may activate a set of equalize lines, apply a zero voltage to a set of digit lines in a memory array, the memory array including a set of ferroelectric memory cells including a set of cell bottom nodes and a set of cell plates opposite the set of cell bottom nodes, and apply an activation voltage to the set of equalize lines.

In some cases, a switching component connects a zero voltage source to the set of digit lines, and where the switching component is activated based on activating the set of equalize lines.

Word line activator 1335 may activate a set of word lines by applying an activation voltage to the set of word lines by an external power source and activate a set of word lines to electrically couple the set of digit lines to the set of cell bottom nodes and reset the set of cell bottom nodes to the voltage. In some cases, a selection component connects the set of digit lines to the set of cell bottom nodes, and the selection component is activated based on activating the set of word lines. In some examples, the selection component may include a transistor including a gate node coupled with one of the set of word lines.

Voltage increase detector 1340 may detect a voltage increase corresponding to a power-up operation, where the zero voltage is applied and the set of word lines are activated in response to detecting the voltage increase corresponding to the power-up operation and detect the voltage increase corresponding to the power-up operation includes detecting, by a voltage level detector, that a power source voltage has met or exceeded a threshold.

Signal generator 1345 may issue one or more signals in response to detecting that the power source voltage has passed a threshold, where the zero voltage is applied and the set of word lines are activated based on the one or more signals. In some cases, a signal generator 1345 may be configured to generate signals to apply the second voltage to the equalize line at each of the set of memory cells and apply the first voltage to the word line at each of the set of memory cells when the voltage level detector detects that the power source voltage has met or exceeded the threshold.

Data wiper 1350 may write a physical data "0" to each of the set of memory cells and write a physical data "0" to each of the set of memory cells includes raising a cell plate voltage of each of the set of cell plates.

Figure 14:
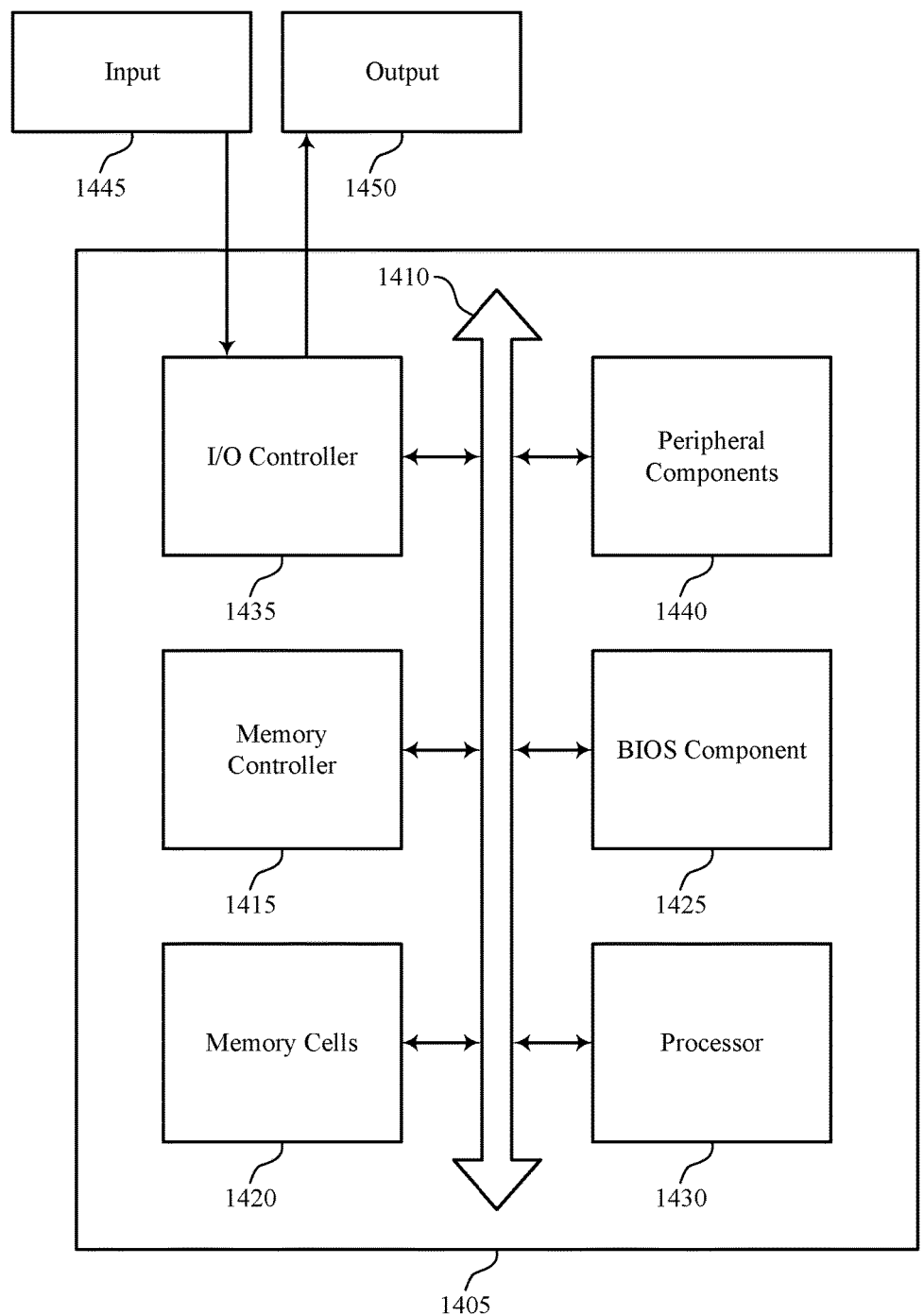
FIG. 14 illustrates a block diagram of a system including a memory array that supports cell bottom node reset in a memory array in accordance with embodiments of the present disclosure.

FIG. 14 shows a diagram of a system 1400 including a device 1405 that supports cell bottom node reset and wipe-out operations in a memory array in accordance with embodiments of the present disclosure. Device 1405 may be an example of or include the components of memory array 100 as described above, e.g., with reference to FIG. 1. Device 1405 may include components for bi-directional voice and data communications including components for transmitting and receiving communications, including memory controller 1415, memory cells 1420, basic input/output system (BIOS) component 1425, processor 1430, I/O controller 1435, and peripheral components 1440. These components may be in electronic communication via one or more buses (e.g., bus 1410).

Memory controller 1415 may operate one or more memory cells as described herein. Specifically, memory controller 1415 may be configured to support cell bottom node reset in a memory array. In some cases, memory controller 1415 may include a row decoder, column decoder, or both, as described herein (not shown).

BIOS component 1425 be a software component that includes BIOS operated as firmware, which may initialize and run various hardware components. BIOS component 1425 may also manage data flow between a processor and various other components, e.g., peripheral components, input/output control component, etc. BIOS component 1425 may include a program or software stored in read only memory (ROM), flash memory, or any other non-volatile memory.

Processor 1430 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1430 may be configured to operate a memory array using a memory controller. In other cases, a memory controller may be integrated into processor 1430. Processor 1430 may be configured to execute computer-readable instructions stored in a memory to perform various functions (e.g., functions or tasks supporting cell bottom node reset in a memory array).

I/O controller 1435 may manage input and output signals for device 1405. I/O controller 1435 may also manage peripherals not integrated into device 1405. In some cases, I/O controller 1435 may represent a physical connection or port to an external peripheral. In some cases, I/O controller 1435 may utilize an operating system such as iOS®, ANDROID®, MS-DOS®, MS-WINDOWS®, OS/2®, UNIX®, LINUX®, or another known operating system. In other cases, I/O controller 1435 may represent or interact with a modem, a keyboard, a mouse, a touchscreen, or a similar device. In some cases, I/O controller 1435 may be implemented as part of a processor. In some cases, a user may interact with device 1405 via I/O controller 1435 or via hardware components controlled by I/O controller 1435.

Peripheral components 1440 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1445 may represent a device or signal external to device 1405 that provides input to device 1405 or its components. This may include a user interface or an interface with or between other devices. In some cases, input 1445 may be managed by I/O controller 1435, and may interact with device 1405 via a peripheral component 1440.

Output 1450 may also represent a device or signal external to device 1405 configured to receive output from device 1405 or any of its components. Examples of output 1450 may include a display, audio speakers, a printing device, another processor or printed circuit board, etc. In some cases, output 1450 may be a peripheral element that interfaces with device 1405 via peripheral component(s) 1440. In some cases, output 1450 may be managed by I/O controller 1435

The components of device 1405 may include circuitry designed to carry out their functions. This may include various circuit elements, for example, conductive lines, transistors, capacitors, inductors, resistors, amplifiers, or other active or inactive elements, configured to carry out the functions described herein. Device 1405 may be a computer, a server, a laptop computer, a notebook computer, a tablet computer, a mobile phone, a wearable electronic device, a personal electronic device, or the like. Or device 1405 may be a portion or aspect of such a device.

Figure 15:
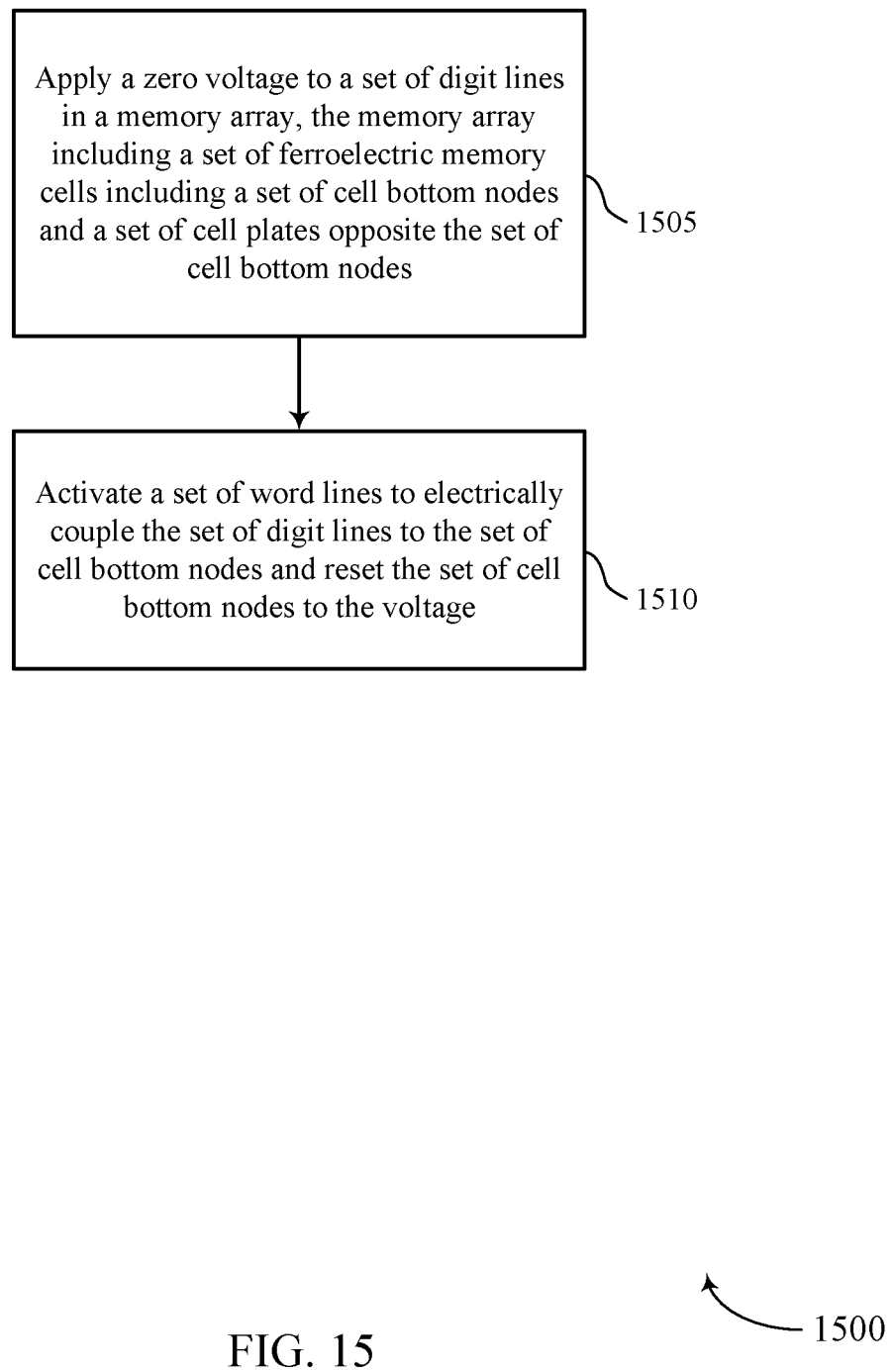
FIGS. 15 through 16 illustrate methods for cell bottom node reset in a memory array in accordance with embodiments of the present disclosure.

FIG. 15 shows a flowchart illustrating a method 1500 for cell bottom node reset in a memory array in accordance with embodiments of the present disclosure. The operations of method 1500 may be implemented by a memory array 100 or its components as described herein. For example, the operations of method 1500 may be performed by a memory controller as described with reference to FIGS. 12 through 14. In some examples, a memory array 100 may execute a set of codes to control the functional elements of the device to perform the functions described below. Additionally or alternatively, the memory array 100 may perform aspects of the functions described below using special-purpose hardware.

At block 1505 the memory array 100 may apply a zero voltage to a plurality of digit lines in a memory array, the memory array comprising a plurality of ferroelectric memory cells comprising a plurality of cell bottom nodes and a plurality of cell plates opposite the plurality of cell bottom nodes. The operations of block 1505 may be performed according to the methods described herein. In certain examples, aspects of the operations of block 1505 may be performed by a zero voltage applicator as described with reference to FIGS. 12 through 14.

At block 1510 the memory array 100 may activate a plurality of word lines to electrically couple the plurality of digit lines to the plurality of cell bottom nodes and reset the plurality of cell bottom nodes to the voltage. The operations of block 1510 may be performed according to the methods described herein. In certain examples, aspects of the operations of block 1510 may be performed by a word line activator as described with reference to FIGS. 12 through 14.

In some cases, the method may also include receiving a signal to perform a reset operation, wherein the zero voltage is applied and the plurality of word lines are activated in response to receiving the signal. In some cases, the method may also include applying the zero voltage by activating a plurality of equalize lines. In some cases, the method may also include activating a plurality of word lines by applying an activation voltage to the plurality of word lines by an external power source.

The method may also include writing a physical data "0" to each of the plurality of memory cells. In some cases, the method may also include detecting a voltage increase corresponding to a power-up operation, wherein the zero voltage is applied and the plurality of word lines are activated in response to detecting the voltage increase corresponding to the power-up operation. In some cases, the method may also include detecting the voltage increase corresponding to the power-up operation by detecting, by a voltage level detector, that a power source voltage has met or exceeded a threshold. In some cases, the method may also include issuing one or more signals in response to detecting that the power source voltage has passed a threshold, wherein the zero voltage is applied and the plurality of word lines are activated based at least in part on the one or more signals.

The method may also include applying a zero voltage to a plurality of digit lines in a memory array, the memory array comprising a plurality of ferroelectric memory cells comprising a plurality of cell bottom nodes and a plurality of cell plates opposite the plurality of cell bottom nodes. In some cases, a switching component connects a zero voltage source to the plurality of digit lines, and wherein the switching component is activated based at least in part on activating the plurality of equalize lines. In some examples, the switching component may include a transistor including a gate node coupled with one of the plurality of equalize lines.

In some cases, the method may also include activating the plurality of equalize lines by applying an activation voltage to the plurality of equalize lines. In some cases, the signal to perform a reset operation may be a power signal. In some cases, a selection component connects the plurality of digit lines to the plurality of cell bottom nodes, and the selection component is activated based at least in part on activating the plurality of word lines. The method may also include activating a plurality of word lines to electrically couple the plurality of digit lines to the plurality of cell bottom nodes and reset the plurality of cell bottom nodes to the voltage. In some cases, the method may also include writing a physical data "0" to each of the plurality of memory cells by raising a cell plate voltage of each of the plurality of cell plates.

Figure 16:
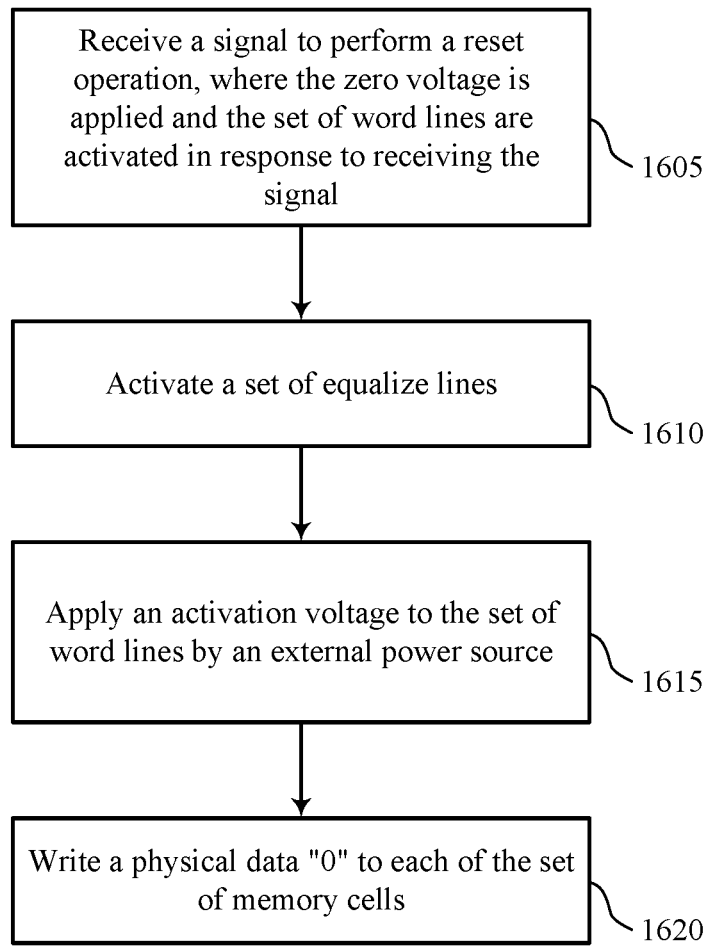

FIG. 16 shows a flowchart illustrating a method 1600 for a wipe-out operation in a memory array in accordance with embodiments of the present disclosure. The operations of method 1600 may be implemented by a memory array 100 or its components as described herein. For example, the operations of method 1600 may be performed by a memory controller as described with reference to FIGS. 12 through 14. In some examples, a memory array 100 may execute a set of codes to control the functional elements of the device to perform the functions described below. Additionally or alternatively, the memory array 100 may perform aspects of the functions described below using special-purpose hardware.

At block 1605 the memory array 100 may receive a signal to perform a reset operation, wherein the zero voltage is applied and the plurality of word lines are activated in response to receiving the signal. The operations of block 1605 may be performed according to the methods described herein. In certain examples, aspects of the operations of block 1605 may be performed by a memory controller as described with reference to FIGS. 12 through 14.

At block 1610 the memory array 100 may activate a plurality of equalize lines. The operations of block 1610 may be performed according to the methods described herein. In certain examples, aspects of the operations of block 1610 may be performed by a zero voltage applicator as described with reference to FIGS. 12 through 14.

At block 1615 the memory array 100 may apply an activation voltage to the plurality of word lines by an external power source. The operations of block 1615 may be performed according to the methods described herein. In certain examples, aspects of the operations of block 1615 may be performed by a word line activator as described with reference to FIGS. 12 through 14.

At block 1620 the memory array 100 may write a physical data "0" to each of the plurality of memory cells. The operations of block 1620 may be performed according to the methods described herein. In certain examples, aspects of the operations of block 1620 may be performed by a data wiper as described with reference to FIGS. 12 through 14.

In some cases, the method may also include receiving a signal to perform a reset operation, wherein the zero voltage is applied and the plurality of word lines are activated in response to receiving the signal. In some cases, the method may also include applying a zero voltage to a plurality of digit lines in a memory array, the memory array comprising a plurality of ferroelectric memory cells comprising a plurality of cell bottom nodes and a plurality of cell plates opposite the plurality of cell bottom nodes. In some cases, the method may also include activating a plurality of word lines to electrically couple the plurality of digit lines to the plurality of cell bottom nodes and write '0' to the plurality of memory cells.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term ground may also refer to or include "virtual ground," which may refer to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled with one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

In some examples, electrically coupling may including "shorting," which refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-onglass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. In some cases, the substrate is an organic substrate.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
applying a zero voltage to a plurality of digit lines in a memory array, the memory array comprising a plurality of ferroelectric memory cells comprising a plurality of cell bottom nodes and a plurality of cell plates opposite the plurality of cell bottom nodes, wherein each of the cell bottom nodes is configured to be electrically coupled with a respective digit line of the plurality of digit lines; and
activating a plurality of word lines to electrically couple the plurality of digit lines to the plurality of cell bottom nodes and reset the plurality of cell bottom nodes to the zero voltage.

2. The method of claim 1, further comprising:
receiving a signal to perform a reset operation, wherein the zero voltage is applied and the plurality of word lines are activated in response to receiving the signal.

3. The method of claim 2, wherein:
the signal to perform the reset operation comprises a power signal.

4. The method of claim 1, further comprising:
detecting a voltage increase corresponding to a power-up operation, wherein the zero voltage is applied and the plurality of word lines are activated in response to detecting the voltage increase corresponding to the power-up operation.

5. The method of claim 4, wherein:
detecting the voltage increase corresponding to the power-up operation comprises detecting, by a voltage level detector, that a power source voltage has met or exceeded a threshold.

6. The method of claim 5, further comprising:
issuing one or more signals in response to detecting that the power source voltage has passed a threshold, wherein the zero voltage is applied and the plurality of word lines are activated based at least in part on the one or more signals.

7. The method of claim 1, wherein:
applying the zero voltage comprises activating a plurality of equalize lines.

8. The method of claim 7, wherein:
a switching component connects a zero voltage source to the plurality of digit lines, and wherein the switching component is activated based at least in part on activating the plurality of equalize lines.

9. The method of claim 7, wherein:
activating the plurality of equalize lines comprises applying an activation voltage to the plurality of equalize lines.

10. The method of claim 1, wherein:
activating the plurality of word lines comprises applying an activation voltage to the plurality of word lines by an external power source.

11. The method of claim 1, wherein:
a selection component connects the plurality of digit lines to the plurality of cell bottom nodes, and the selection component is activated based at least in part on activating the plurality of word lines.

12. The method of claim 1, further comprising:
writing a physical data "0" to each of the plurality of memory cells.

13. The method of claim 12, wherein:
writing a physical data "0" to each of the plurality of memory cells comprises raising a cell plate voltage of each of the plurality of cell plates.

14. A device, comprising:
a zero voltage source;
a memory array comprising a plurality of ferroelectric memory cells, each of the ferroelectric memory cells comprising:
a cell plate;
a cell bottom node opposite the cell plate;
a selection component configured to connect the cell bottom node to a digit line upon application of a first voltage to a word line, wherein each of the cell bottom nodes is configured to be electrically coupled with a respective digit line; and
a switching component configured to connect the digit line to the zero voltage source upon application of a second voltage to an equalize line.

15. The device of claim 14, wherein:
the selection component comprises a transistor comprising a gate node coupled with the word line.

16. The device of claim 14, wherein:
the switching component comprises a transistor comprising a gate node coupled with the equalize line.

17. The device of claim 14, further comprising:
a voltage level detector configured to detect that a power source voltage has met or exceeded a threshold.

18. The device of claim 17, further comprising:
a signal generator configured to generate signals to apply the second voltage to the equalize line and apply the first voltage to the word line when the voltage level detector detects that the power source voltage has met or exceeded the threshold.

19. The device of claim 14, further comprising:
an external power source; and
a power source selection component connecting the external power source to the word line in each of the plurality of ferroelectric memory cells, wherein the power source selection component is configured to be activated upon application of a third voltage to a reset line.

20. A device, comprising:
a zero voltage source;
a plurality of memory cells, each of the plurality of memory cells comprising a digit line, a cell bottom node, and a cell plate opposite the cell bottom node;
a controller operable to cause the device to:
apply a voltage of the zero voltage source to the digit line in each of the plurality of memory cells, wherein each of the cell bottom nodes is configured to be electrically coupled with a respective digit line of the plurality of digit lines; and
apply a first voltage to each of a plurality of word lines to electrically couple the digit line to the cell bottom node in each of the plurality of memory cells and reset the cell bottom node in each of the plurality of memory cells.

21. The device of claim 20, wherein the controller is operable to cause the device to:
apply the voltage of the zero voltage source to the digit line in each of the plurality of memory cells and apply the first voltage to the plurality of word lines in response to receiving a signal to perform a reset operation.

22. The device of claim 20, wherein each of the plurality of memory cells is coupled with an equalize line and the device further comprises:

a switching component connecting the digit line to the equalize line, wherein the switching component is configured to be activated upon application of a second voltage to the equalize line.

23. The device of claim 22, wherein the controller is operable to cause the device to:

apply the second voltage to the equalize line; and apply the voltage of the zero voltage source to the digit line in each of the plurality of memory cells based at least in part on applying the second voltage to the equalize line in each of the plurality of memory cells.

24. The device of claim 20, wherein each of the plurality of memory cells comprises a selection component connecting the cell bottom node to the digit line, and wherein the selection component is configured to be activated upon application of the first voltage to one of the plurality of word lines.

25. The device of claim 20, wherein the controller is operable to cause the device to:

raise a cell plate voltage of the cell plate at each of the plurality of memory cells after the first voltage is applied to the plurality of word lines.

26. The device of claim 20, wherein the controller is further operable to cause the device to:

write a physical data "0" to each of the plurality of memory cells after the first voltage is applied to the plurality of word lines.

* * * * *